United States Patent [19]

Harnishfeger et al.

[11] Patent Number: 5,491,434
[45] Date of Patent: Feb. 13, 1996

[54] CIRCUIT AND METHOD OF DIFFERENTIAL AMPLITUDE DETECTION

[75] Inventors: David B. Harnishfeger, Chandler; Michael J. Pennell, Phoenix, both of Ariz.

[73] Assignee: Motorola, Inc., Schaumburg, Ill.

[21] Appl. No.: 349,331

[22] Filed: Dec. 5, 1994

[51] Int. Cl.$^6$ .............................. H03D 1/00; G01R 19/00
[52] U.S. Cl. .................. 327/50; 327/52; 327/54; 327/58; 327/65; 327/67
[58] Field of Search .................. 327/58, 59, 60, 327/62, 63, 65, 67, 72, 73, 560, 563, 231, 50, 52, 54

[56] References Cited

U.S. PATENT DOCUMENTS

| | | | |
|---|---|---|---|
| 4,631,737 | 12/1986 | Davis et al. | 327/58 |
| 4,698,523 | 10/1987 | Gershon et al. | 327/61 |
| 4,985,683 | 1/1991 | O'Neill | 327/231 |
| 4,994,692 | 2/1991 | Wolke | 327/58 |
| 5,120,995 | 6/1992 | Abdi | 327/61 |
| 5,247,211 | 9/1993 | Sakura | 327/58 |
| 5,253,249 | 10/1993 | Fitzgerald et al. | 375/7 |
| 5,287,063 | 2/1994 | Izawa | 327/62 |
| 5,303,266 | 4/1994 | Budin et al. | 375/36 |
| 5,305,350 | 4/1994 | Budin et al. | 375/12 |
| 5,381,052 | 1/1995 | Kolte | 327/58 |
| 5,412,692 | 5/1995 | Uchida | 327/58 |

*Primary Examiner*—Timothy P. Callahan
*Assistant Examiner*—Trong Phan
*Attorney, Agent, or Firm*—Robert D. Atkins

[57] ABSTRACT

A differential amplitude detection circuit (10) passes the positive and negative components of a data communication differential signal through peak detector circuits (12) and (26), respectively. The peak detected voltages are held at first (15) and second (37) nodes by holding capacitors (14) and (28). Current loads (18) and (30) sink predetermined currents from the first and second nodes to prevent the peak voltages from becoming accumulated by the holding capacitors. The peak detected voltages are summed by summing circuit (21) to provide a signal $V_{OUT}$ that is absent of DC offset voltage errors that were present in the originally transmitted data signal. First and second resistors (36, 38) extract the common mode component of the input signal which may be subtracted from the $V_{OUT}$ signal for providing an error free true data output signal VTO.

19 Claims, 1 Drawing Sheet

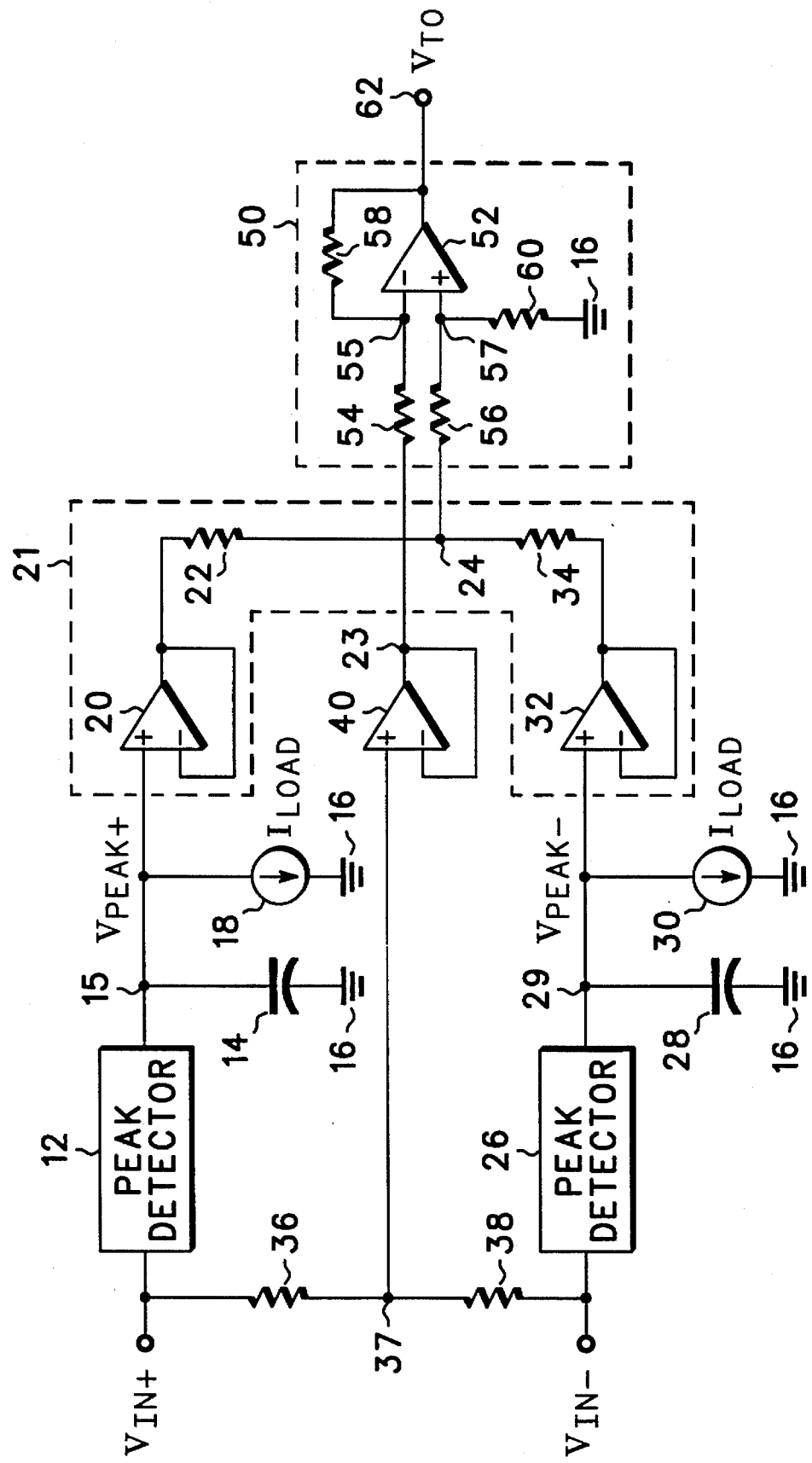

CIRCUIT AND METHOD OF DIFFERENTIAL AMPLITUDE DETECTION

BACKGROUND OF THE INVENTION

The present invention relates in general to amplitude detection circuits and, more particularly, to a differential amplitude detection circuit with DC offset rejection.

In many electronic systems it is often necessary to accurately measure the amplitude of a signal. The amplitude information can be used in many ways. One such way is to regulate a control loop. In regulating control loops, accuracy and common mode rejection are critical, and differential amplitude detection techniques are used. But even with differential techniques, there can be other contributing cources of error. For instance, when circuits are AC coupled and the signal passing between them is unbalanced, a differential offset voltage can be accumulated in the signal. The offset voltage is a result of the unbalanced signal spending more time, on the average, in one level than in the other level.

In data comunications systems a transmission line to is typically coupled to a receiver with an isolation transformer for isolation purposes. In some coding techniques where the data transmission signal spends more time in one state than another, the isolation transformer develops a saturation current that creates a DC offset at the receiver on the secondary side of the isolation transformer. If the data signal is high more than it is low, the DC offset creates a differential signal error. In the past, when offset errors were of concern in system performance, attempts were made to alter the structure of the transmitted code. The transmitted coding scheme was designed such that the time data resided in a high state was matched to the time data resides in the low state. Thus the system transmission bandwith had to be increased to accommodate the coding overhead. Therefore, prior art attempts at amplitude detection circuits lack features for compensation of offset errors.

Therefore, the detector cannot distinguish between the differential data signal and the differential offset signal.

Hence, a need exists to eliminate differential offset from the differential data signal on the received side of a transmission line.

BRIEF DESCRIPTION OF THE DRAWING

The sole FIGURE illustrates a differential amplitude detection circuit.

DETAILED DESCRIPTION OF THE PREFERRED EMBODIMENT

Referring to the sole figure, a differential amplitude detection circuit 10 receives signals $V_{IN+}$ and $V_{IN-}$. The $V_{IN+}$ and $V_{IN-}$ signals are single-ended components of the received differential signal. The $V_{IN+}$ signal is applied to an input of peak detector circuit 12. Peak detector circuit 12 provides a peak signal $V_{PEAK+}$ of the $V_{IN+}$ signal at its output. A holding capacitor 14 is coupled between the output of peak detector circuit 12 at node 15 and power supply conductor 16 operating at ground potential. Current load circuit 18 sinks current $I_{LOAD}$ from node 15 into power supply conductor 16. The $V_{PEAK+}$ signal is applied to a non-inverting input of buffer amplifier 20. Buffer amplifier 20 is configured as a voltage follower with the output of buffer amplifier 20 coupled to its inverting input. The output of buffer amplifier 20 is coupled through resistor 22 to output node 24. The $V_{IN-}$ signal is applied to an input of peak detector circuit 26 that provides a peak signal $V_{PEAK-}$ of the $V_{IN-}$ signal at its output. Holding capacitor 28 is coupled between the output of peak detector circuit 26 at node 29 and power supply conductor 16. Current load circuit 30 sinks current $I_{LOAD}$ from node 29 into power supply conductor 16. The $V_{PEAK-}$ signal is applied to a non-inverting input of buffer amplifier 32 operating as a voltage follower with its the output of buffer amplifier 32 coupled to its inverting input. The output of buffer amplifier 32 is coupled through resistor 34 to output node 24. Summing circuit 21 includes buffer amplifiers 20 and 32, resistors 22 and 34, and output node 24.

The inputs of peak detector circuits 12 and 26 are coupled together through resistors 36 and 38, respectively. Node 37 at the interconnection of resistors 36 and 38 is coupled to a non-inverting input of buffer amplifier 40 that is configured as a voltage follower with its output coupled to its inverting input. The output of buffer amplifier 40 provides the common mode voltage component $V_{CM}$ of the $V_{IN+}$ and $V_{IN-}$ signals at node 23.

Subtraction circuit 50 includes amplifier 52 and resistors 54, 56, 58, and 60. Resistor 54 is coupled between node 23 and node 55. The output of amplifier 52 is coupled to resistor 58 at node 62. The signal $V_{TO}$ appearing at node 62 is the true representation of the differential data input signal of differential amplitude detection circuit 10. $V_{TO}$ is the resultant signal that excludes the offset error voltage and the common mode component of the differential input voltage. The output of amplifier 52 is fedback through resistor 58 to the negative input node 55 of amplifier 52. The negative input of amplifier 52 is also coupled through resistor 54 to the output $V_{CM}$ of buffer amplifier 40 at node 23. The positive input of amplifier 52 and resistor 60 are coupled to node 57. Resistor 60 is further coupled to power supply conductor 16. The output $V_{OUT}$ at node 24 is coupled through resistor 56 to the positive input of amplifier 52.

The operation of differential amplitude detection circuit 10 proceeds as follows. Peak detector circuit 12 is coupled for receiving the $V_{IN+}$ signal. The $V_{IN+}$ signal is the positive single-ended component of the differential input signal. The $V_{IN+}$ signal is the sum of the common mode input signal, the incoming data signal and the corresponding offset signal. The $V_{PEAK+}$ signal from peak detector circuit 12 is stored on holding capacitor 14. The addition of current load circuit 18 allows $V_{PEAK+}$ to track any decreasing offset component contained in the $V_{IN+}$ signal. Current load circuit 18 can be a constant current source, a variable current source, or a resistor. Buffer amplifier 32 provides buffering of the $V_{PEAK+}$ signal from additional loading through resistor 22.

Peak detector circuit 26 is coupled for receiving the $V_{IN-}$ signal. The $V_{IN-}$ signal is the sum of the common mode input signal, the incoming data signal and the corresponding offset signal. The $V_{PEAK-}$ signal from peak detector circuit 26 is stored on holding capacitor 28. The addition of current load circuit 30 allows $V_{PEAK-}$ to track any decreasing offset component contained in the $V_{IN-}$ signal. Current load circuit 30 can be a constant current source, a variable current source, or a resistor. Buffer amplifier 20 provides buffering of the $V_{PEAK-}$ signal from additional loading through resistor 34.

Summing circuit 21 includes buffer amplifiers 20 and 32, and resistors 22 and 34. The output signals of buffer amplifiers 20 and 32 are added through resistors 22 and 34 respectively to produce signal $V_{OUT}$ at output node 24. $V_{OUT}$ is the output of summing circuit 21.

The input signals $V_{IN+}$ and $V_{IN-}$ to differential amplitude detection circuit 10 are added through resistors 36 and 38, respectively. The resulting signal is buffered through buffer amplifier 40 to produce signal $V_{CM}$ at node 23. $V_{CM}$ is the resulting common mode component signal of the inputs $V_{IN+}$ and $V_{IN-}$.

As a feature of the present invention, the offset component of $V_{PEAK+}$ is equal and opposite in polarity to the offset component appearing in $V_{PEAK-}$. Therefore, when the output of buffer amplifier 20 is added to the output of buffer amplifier 32, the offset components of $V_{IN+}$ and $V_{IN-}$ are canceled at output node 24 $V_{OUT}$. However, the resulting signal $V_{OUT}$ also contains the original component of common mode voltage.

The component of common mode voltage can be eliminated from $V_{OUT}$ by subtracting the signal appearing at $V_{CM}$ from the signal appearing at $V_{OUT}$. The resultant $V_{TO}$ signal contains only the desired signal amplitude of the original data input signal.

The operation of differential amplitude detection circuit 10 of the sole figure can also be expressed mathematically as follows. The $V_{IN+}$ and $V_{IN-}$ signals can be represented as:

$$V_{IN+} = V_{CM} + V_{SIGNAL} - V_{OFFSET} \quad (1)$$

$$V_{IN-} = V_{CM} - V_{SIGNAL} + V_{OFFSET} \quad (2)$$

where:

$V_{CM}$ is the common mode component of the received signal;

$V_{SIGNAL}$ is the true data portion of the received signal; and $V_{OFFSET}$ is the offset error portion of the received signal.

$V_{OFFSET}$ is the error voltage caused by transmission coding techniques, transmission media, and receiving coupling media.

In the sole FIGURE, $V_{PEAK+}$ and $V_{PEAK-}$ can be described by the equations:

$$V_{PEAK+} = \text{Peak}(V_{CM} + V_{SIGNAL} - V_{OFFSET}) \quad (3)$$

$$V_{PEAK-} = \text{Peak}(V_{CM} - V_{SIGNAL} + V_{OFFSET}) \quad (4)$$

where:

the Peak ( ) function determines the peak values of $V_{IN+}$ and $V_{IN-}$.

Summing circuit 21 operates on $V_{PEAK+}$ and $V_{PEAK-}$ as follows:

$$V_{OUT} = (V_{PEAK+} + V_{PEAK-})/2 \quad (5)$$

Substituting equations (3) and (4) into equation (5) yields $$V_{OUT} = (\text{Peak}(V_{CM} + V_{SIGNAL} - V_{OFFSET}) + \text{Peak}(V_{CM} - V_{SIGNAL} + V_{OFFSET}))/2 \quad (6)$$

and further reducing equation (6) yields $$V_{OUT} = V_{CM} + \text{Peak}(V_{SIGNAL}) \quad (7)$$

The common mode component signal $V_{CM}$ of $V_{OUT}$ can be removed with subtraction circuit 50. In subtraction circuit 50, the common mode component of the differential input signal is applied to the negative input of amplifier 52 at node 55. The output signal $V_{OUT}$ at node 24, which is the sum of the true data signal and the common mode component of the differential signal, supplied to the positive input of amplifier 52 at node 57. The feedback configuration of resistors 54, 56, 58, and 60 is arranged such that the $V_{CM}$ signal at node 23 is subtracted from $V_{OUT}$, thus providing an accurate representation of the originally transmitted data signal at node 62. As can be seen from equation (7), the offset error voltage has been eliminated by differential amplitude detection circuit 10.

To provide complete cancellation of the offset voltage error at $V_{OUT}$, the change in voltage with respect to time of current load circuit 18 in conjunction with holding capacitor 14 and the change in voltage with respect to time of current load circuit 30 in conjunction with holding capacitor 28, must equal to or exceed change in offset voltage with respect to time of the differential input signal. In addition, peak detector circuit 12 and peak detector circuit 26 must be chosen such that the respective peak detector circuits 12 and 26 have adequate bandwidth to track the input differential signal. Matching of holding capacitors 14 and 28, current load circuits 18 and 30, resistors 36 and 38, and resistors 22 and 34 respectively, further serves to enhance the offset elimination feature in differential amplitude detection circuit 10.

By now it can be appreciated that the present invention provides a circuit and method for eliminating differential offset errors from differential data signals received from a transmission line. The single-ended positive and negative components of the differential data signal are channeled through parallel peak detection paths. The outputs of the peak detectors are furnished with current loads that inhibit an accumulation of voltage at the peak detector output and thus provide an accurate representation of the detected peak voltages. The detected peak voltages are input into a summing circuit that cancels the offset components caused by data transmission media effects.

As another advantage of the present invention a circuit is provided to separate the common mode component of the differential signal from the differential signal. The common mode component can then be subtracted from the summed peak voltage signals to provide an error free replica of the originally transmitted data signal.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A differential amplitude detection circuit, comprising:

a first peak detector circuit having an input coupled for receiving a first component of a differential input signal and having an output for providing a first peak signal;

a second peak detector circuit having an input coupled for receiving a second component of said differential input signal and having an output for providing a second peak signal;

a first current load circuit coupled to said output of said first peak detector circuit for tracking a decreasing offset component of said first component of said differential input signal;

a second current load circuit coupled to said output of said second peak detector circuit for tracking a decreasing offset component of said second component of said differential input signal; and a summing circuit having first and second inputs respectively coupled for receiving said first and second peak signals and having an output coupled to an output node of the differential amplitude detection circuit for providing a signal representative of an amplitude of said differential input signal.

2. The differential amplitude detection circuit of claim 1, further comprising a first holding capacitor coupled to said output of said first peak detector circuit.

3. The differential amplitude detection circuit of claim 2, further comprising a second holding capacitor coupled to said output of said second peak detector circuit.

4. The differential amplitude detection circuit of claim 1, wherein said summing circuit comprises a first buffer amplifier having an input coupled for receiving said first peak signal and having an output coupled to said output node of the differential amplitude detection circuit.

5. The differential amplitude detection circuit of claim 4, wherein said summing circuit comprises a first resistor coupled between said output of said first buffer amplifier and said output node of the differential amplitude detection circuit.

6. The differential amplitude detection circuit of claim 1, wherein said summing circuit comprises a second buffer amplifier having an input coupled for receiving said second peak signal and having an output coupled to said output node of the differential amplitude detection circuit.

7. The differential amplitude detection circuit of claim 6, wherein said summing circuit comprises a second resistor coupled between said output of said second buffer amplifier and said output node of the differential amplitude detection circuit.

8. The differential amplitude detection circuit of claim 1, wherein:

said first current load circuit comprises a third resistor; and said second current load circuit comprises a fourth resistor.

9. The differential amplitude detection circuit of claim 1, further comprising:

circuit means for providing a common mode component signal of said differential input signal.

10. The differential amplitude detection circuit of claim 9, wherein said circuit means comprises:

a first resistor having a first terminal coupled for receiving said first component of said differential input signal;

a second resistor having a first terminal coupled for receiving said second component of said differential input signal and having a second terminal coupled to a second terminal of said first resistor; and a third buffer amplifier having an input coupled to said second terminals of said first and second resistors and having an output for providing a common mode component of said differential input signal.

11. The differential amplitude detection circuit of claim 10, further comprising a subtraction circuit having a first input coupled to said output of said summing circuit, a second input coupled to said output of said third buffer amplifier, and an output coupled to an output node for providing a signal representative of a difference between said output of said summing circuit and said common mode component of said differential input signal.

12. The differential amplitude detection circuit of claim 11, wherein said subtraction circuit includes:

a third resistor coupled between said output node of said summing circuit of said differential amplitude detection circuit and a positive input of an amplifier having an output;

a fourth resistor coupled between said output of said third buffer amplifier and a negative input of said amplifier;

a fifth resistor coupled between said positive input of said amplifier and a power supply conductor; and a sixth resistor coupled between said output and said negative input of said amplifier.

13. A method of detecting differential amplitude, including the steps of:

storing a first peak amplitude of a first component of a differential input signal;

storing a second peak amplitude of a second component of said differential input signal;

tracking a decreasing offset component of said first component of said differential input signal with said first peak amplitude;

tracking a decreasing offset component of said second component of said differential input signal with said second peak amplitude; and summing said first and second peak amplitudes for providing a signal representative of an amplitude of said differential input signal.

14. The method of detecting differential amplitude of claim 13, further including the step of extracting a common mode component signal from said differential input signal.

15. The method of detecting differential amplitude of claim 14, further including the step of subtracting said common mode component signal from said signal representative of an amplitude of said differential input signal.

16. A differential amplitude detection circuit, comprising:

a first peak detector circuit having an input coupled for receiving a first component of a differential input signal and having an output for providing a first peak signal;

a first holding capacitor coupled to said output of said first peak detector circuit;

a first current load circuit coupled to said output of said first peak detector circuit for tracking a decreasing offset component of said first component;

a first buffer amplifier having an input coupled for receiving said first peak signal and having an output;

a first resistor coupled between said output of said first buffer amplifier and a first output node;

a second peak detector circuit having an input coupled for receiving a second component of said differential input signal and having an output for providing a second peak signal;

a second holding capacitor coupled to said output of said second peak detector circuit;

a second current load circuit coupled to said output of said second peak detector circuit for tracking a decreasing offset component of said second component;

a second buffer amplifier having an input coupled for receiving said second peak signal and having an output; and a second resistor coupled between said output of said second buffer amplifier and said first output node.

17. The differential amplitude detection circuit of claim 16, further comprising:

a third resistor coupled between said input of said first peak detector circuit and an input of a third buffer amplifier; and a fourth resistor coupled between said input of said second peak detector circuit and said input of said third buffer amplifier, said third buffer amplifier having an output for providing a common mode component signal of said differential input signal.

18. The differential amplitude detection circuit of claim 17 further including a subtraction circuit having a first input coupled said first output node, a second input coupled to said output of said third buffer amplifier, and an output coupled to a second output node for providing a signal representative of a difference between said output of said first output node and said common mode component of said differential input signal.

19. The differential amplitude detection circuit of claim 18, wherein said subtraction circuit includes:

an amplifier having a first input, a second input, and an output;

a fifth resistor coupled between said first output node of the differential amplitude detection circuit and said first input of said amplifier;

a sixth resistor coupled between said output of said third buffer amplifier and said second input of said amplifier;

a seventh resistor coupled between said positive input of said amplifier and a power supply conductor; and an eighth resistor coupled between said output and said second input of said amplifier.

* * * * *